United States Patent [19]
Adams et al.

[11] Patent Number: 5,761,213
[45] Date of Patent: Jun. 2, 1998

[54] METHOD AND APPARATUS TO DETERMINE ERRONEOUS VALUE IN MEMORY CELLS USING DATA COMPRESSION

[75] Inventors: Robert Dean Adams, Essex Junction; John Connor, Burlington; Garrett Stephen Koch, Cambridge; Luigi Ternullo, Jr., Colchester, all of Vt.

[73] Assignee: International Business Machines Corporation, Armonk, N.Y.

[21] Appl. No.: 603,963

[22] Filed: Feb. 20, 1996

Related U.S. Application Data

[63] Continuation-in-part of Ser. No. 398,468, Mar. 3, 1995.
[51] Int. Cl.[6] .................................................. G01R 31/28
[52] U.S. Cl. ............................................. 371/22.5; 371/251
[58] Field of Search .............................. 371/22.1, 22.2, 371/22.4, 22.5, 22.6, 25.1, 27, 21.2

[56] References Cited

U.S. PATENT DOCUMENTS

| | | |
|---|---|---|
| 5,051,997 | 9/1991 | Sakashita et al. |
| 5,138,619 | 8/1992 | Fasang et al. |
| 5,173,906 | 12/1992 | Dreibelbis et al. |
| 5,260,906 | 11/1993 | Mizukami |
| 5,301,156 | 4/1994 | Talley |
| 5,329,471 | 7/1994 | Swoboda et al. |
| 5,349,587 | 9/1994 | Nadeau-Dostie et al. |
| 5,351,213 | 9/1994 | Nakashima |
| 5,377,148 | 12/1994 | Rajsuman .................. 371/25.1 |
| 5,388,104 | 2/1995 | Shirotori et al. |
| 5,442,641 | 8/1995 | Beranger et al. |
| 5,515,383 | 5/1996 | Katoozi .................. 371/22.4 |

OTHER PUBLICATIONS

"Testing Embedded Single and Multi-Port RAMs Using BIST and Boundary Scan," Alves, et al., IMAG/TIMA Laboratory publication, 1992 IEEE.

*Primary Examiner*—Vincent P. Canney
*Attorney, Agent, or Firm*—Calfee, Halter & Griswold LLP

[57] ABSTRACT

A method and circuit are provided to detect if any bit stored in a given location in a memory is different from the data expected. The circuit includes logic to read each of the bits stored in the cells at given locations from memory and to generate a fail signal based on the data expected to be stored if the stored data is different from the expected data. The circuit also preferably includes logic to compare the True data and expect data read from each cell and generating the fail signal if they are the same. Additional logic circuitry is also preferably provided which determines if a node of the circuit remains in a precharged condition.

17 Claims, 2 Drawing Sheets

METHOD AND APPARATUS TO DETERMINE ERRONEOUS VALUE IN MEMORY CELLS USING DATA COMPRESSION

RELATED APPLICATIONS

This is a continuation-in-part of application Ser. No. 08/398,468, filed Mar. 3, 1995, and entitled "BIST Tester for Multiple Memories" (Attorney Docket No. BU9-94-146).

FIELD OF THE INVENTION

This invention relates generally to data output compression schemes, and more particularly to data output compression schemes that are especially adapted for use in built-in self-test (BIST) devices for testing memories on integrated circuit (IC) chips.

BACKGROUND INFORMATION

In the manufacture of memories which are embedded on IC chips, it is necessary to test the memories under various conditions to assure that the memory cells are "good". If the memory cells are determined to have failed or not be operative, according to pre-selected specifications, the memory is either rejected or these particular memory cells are isolated and not used. A common practice for testing memory is by the use of the so-called built-in self-test which is a testing device that is actually built on the IC chip and is used to test the memory embedded on the same chip or related chips. This test can take place immediately following the manufacture of the memory, or it can take place periodically later on after the memory is in use to ensure that the storage cells continue to function according to specification.

One of the requirements of testing the memory is to capture data as to memory cell failures and output a failure signal when the data expected is not received during the test procedure. In order to perform these tests in an effective amount of time, a great deal of data must be collected in a short period of time and then compressed in such a way as to output a signal when a failure has been indicated. This requires some sort of data compression system to which the present invention is directed.

SUMMARY OF THE INVENTION

A method and circuit are provided to detect if any bit stored in a given location in a memory is different from the data expected. The circuit includes logic to read each of the bits stored in the cells at given locations from memory and to generate a signal based on the data expected to be stored if the stored data is different from the expected data.

DESCRIPTION OF THE PREFERRED EMBODIMENT(S)

Figure 1:
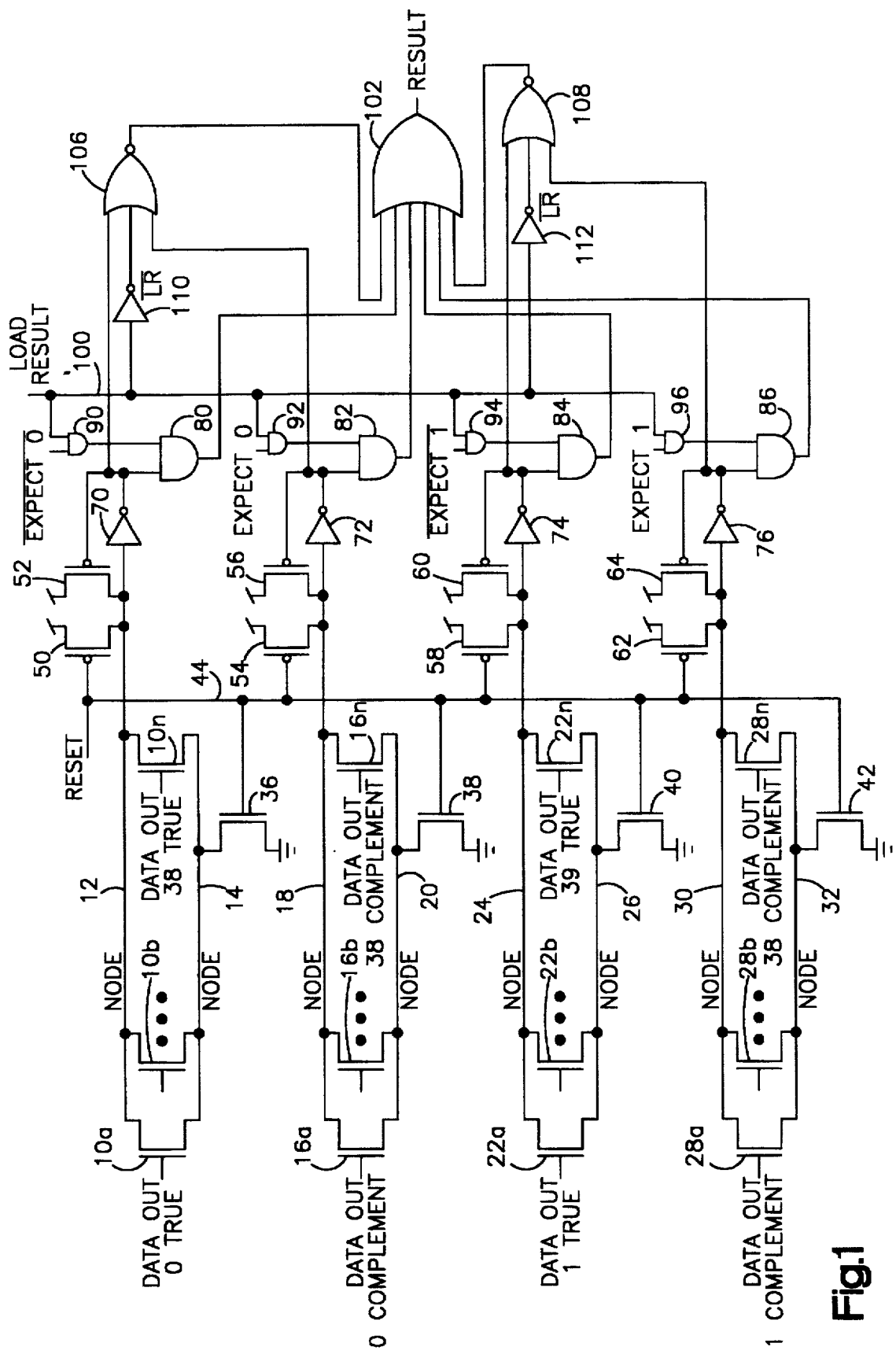
FIG. 1 is a circuit diagram, somewhat schematic, showing one embodiment of the data compression system of the present invention for use in a built-in self-test machine.

Before referring to the drawings directly, an overview of the storage scheme of certain types of memories which can be tested by this invention will aid in the understanding of the invention. Memories contained on integrated circuit chips are organized to store data which can be addressed by row and by column, and the data which is so organized is stored at the particular address location in a series or group of memory cells, wherein each cell contains a single binary bit of information. The bits of information are read from the cells usually as a group, with the bits together constituting data bytes and parity or error correction code (ECC) bits. One particularly useful arrangement is to have the memory arranged in cells of 40 bits each, which allows for different types or schemes of parity or error correction. (However, the particular scheme of organizing these bits is unimportant; nor is the number of bits critical to the present invention.) Each of these memory cells must be tested by generating patterns which write either a "1" or a "0" to the cell and then reading out the contents of the cell after it has been written with a known pattern of "1's" and "0's" to determine if what is read out is indeed what was written in during this particular pattern. Various patterns are used successively to test the cells. The writing and reading of the bits must be done very rapidly, and is done with many different types of patterns. Characteristic of all of these patterns, however, is that at some point in the testing, all of the cells have the same bit value, i.e., "1" or "0", or the alternating cells have the same bit value, i.e., "1" or "0". Expressed another way, if the memory outputs are considered to be numbered from 0 to 39 (giving 40 bits), outputs 0, 2, 4, 6 up to 38 (even outputs) would all have the same bit value, and the memory outputs 1, 3, 5, 7, 9 and up to 39 (odd outputs) would also all have the same bit value. Thus, the "odd" and "even" locations are interleaved to form an addressable data storage location. At some point in the testing, these bit values may be either the same or different between the even and the odd outputs; but, during the testing all of the even outputs have the same value and all of the odd outputs have the same value, whether this is the same between the even and the odd outputs or not. This is one of the features of testing that is relied upon in the present invention.

During the testing of the memory with various types of test patterns, at any given point in the testing, 40 memory cells are written with a particular pattern of "1's" and "0's". Following this, the particular pattern is read to determine if indeed the proper or anticipated pattern has been read out, which indicates a PASS condition. In the alternative, if one of the cells writes out a data bit which is different from that expected, this indicates a FAIL condition. It is necessary to isolate within a memory a failure of a particular cell with that particular group of cells, and if such a failure is detected, the entire group of 40 memory cells must be isolated since the storage takes place in the 40 cells as a group. Thus, a failure of any one of the memory cells in a group of 40 (or whatever number of cells is being tested) will indicate a failure of the entire group of cells for information storage purposes.

Referring now to the drawings and for the present to FIG. 1, one embodiment of the data compression scheme for use in a BIST machine on a semiconductor or IC chip is shown. A series of NFET transistors 10a–10n are provided, each of which is connected between a pair of nodes 12 and 14. The gates of the transistors 10a–10n are each connected to read the true data from one of the even number locations of memory cells (not shown) contained in a memory to be tested, i.e., in a memory with 40 outputs, transistor 10a would be connected to the "0" output, 10b would be connected to the 2 output, through 10n which would be connected to the 38 memory cell. True data refers to the binary value of the data actually stored, i.e., if the data stored is a logic "0", a logic "0" is read; if the logic value is a logic "1", then a logic "1" is read. Similarly, NFET transistors 16a–16n are connected between nodes 18 and 20, and the gates of the transistors 16a–16n are connected to a circuit (not shown) which generates the compliment of the true data read from each of the even numbered memory outputs, i.e. if the true data read from memory output 2 is a logic "0", the compliment will be a logic "1", or conversely, if the bit read from the memory output 2 is a logic "1", the compliment will be a logic "0". This is the definition of the term "compliment data" as used herein.

A series of NFET transistors 22a–22n are connected between nodes 24 and 26, and the gates of the NFET transistors 22a–22n are each connected to the true, odd numbered data outputs, i.e., memory outputs 1, 3, 5, up through 39, so as the true data stored in the memory cells selected is impressed on the gates of the transistors 22a–22H. NFET transistors 23a through 28n are connected between nodes 30 and 32, and the gates of the transistors 28a–28n are connected to circuitry (not shown) which generates the compliment of the odd numbered data outputs in a memory array. Thus, the transistors 10a–10n, 16a–16n, 22a–22n and 28a–28n together read the true and compliment data out of each of the 40 memory outputs in a memory having a 40-bit storage configuration and actuated during a read cycle during testing.

Node 14 is connected through NFET transistor 36 to ground, node 20 is connected through NFET transistor 38 to ground, node 26 is connected through NFET transistor 40 to ground, and node 32 is connected through NFET transistor 42 to ground. The gates of each of the transistors 36, 38, 40 and 42 are connected to a RESET signal line 44 which receives a RESET signal from a BIST machine (not shown). PFET transistors 50 and 52 are each connected across node 12 to supply voltage; the gate of transistor 50 is connected to the RESET signal line 44. PFET transistors 54 and 56 are each connected across node 18 and the supply voltage with the gate of transistor 54 being connected to RESET signal line 44. PFET transistors 58 and 60 are each connected across node 24 and the supply voltage with the gate of transistor 58 being connected to RESET signal line 44, and PFET transistors 62 and 64 are connected across node 30, and the supply voltage with the gate of transistor 62 being connected to RESET signal line 44. Node 12 has connected thereto an inverter 70 which provides one input to AND gate 80; node 18 has connected thereto an inverter 72 which provides one input to AND gate 82; node 24 has an inverter 74 connected thereto which is connected as one input to AND gate 84; and node 30 has inverter 76 connected thereto, the output of which is connected as an input to AND gate 86. AND gates 90, 92, 94 and 96 are provided, the outputs of each of which provide the other inputs, respectively, to AND gates 80, 82, 84 and 86.

A load result line 100 is connected as one input to each of AND gates 90, 92, 94 and 96. The compliment of the expect data for the even numbered outputs is provided as the other input to AND gate 90; expect data is provided for the even numbered outputs as the other input to AND gate 92; the compliment of the expect data for the odd numbered outputs is provided as the other input to AND gate 94; and the expect data for the odd numbered outputs is provided as the other input to AND gate 96. The outputs of AND gates 80, 82, 84 and 86 provide four of the inputs to OR gate 102.

The outputs of inverters 70 and 72 are also provided as two inputs to NOR gate 106, the third input of which is provided from the load result line 100 through inverter 110. The output of NOR gate 106 is provided as an input to OR gate 102. Similarly, the outputs of inverters 74 and 76 are provided as two inputs to NOR gate 108, the other input of which is from load result line 100 through inverter 112. The output from NOR gate 108 is provided as another input to OR gate 102.

The circuit of FIG. 1 operates in the following manner. At the beginning of the cycle in which the data is to be read out, an active low RESET signal is applied to line 44 which will cause transistors 50, 54, 58 and 62 to charge nodes 12, 18, 24 and 30 HIGH to the value of the supply voltage. This will also cause FET transistors 36, 38, 40 and 42 to turn off. At this point and in a stable condition before any data is read out, the transistors 10a–10n, 16a–16n, 22a–22n and 28a–28n are turned off, thus isolating the nodes 12, 18, 24 and 30 from the nodes 14, 20, 26 and 32, respectively.

In order to perform a test function, data is read from the memory cells and outputted to transistors 10a–10n, 16a–16n, 22a–22n and 28a–28n as either true data or compliment data from their respective outputs in memory. This data can be read directly from the cells, or indirectly through latches or the like. The data applied to transistors 10a–10n being the actual or true data, and the even outputs applied to transistors 16a–16n being the compliment or inverse of the true data; the data applied to transistors 22a–22n being the true data from the odd numbered memory outputs, and the data read into transistors 28a–28n being the compliment or inverse of the data from the odd numbered outputs. If any of the outputs read out data other than that which was expected, an error signal will be generated from the OR gate 102. This can be understood as follows. First, when the data is read, the load result line is driven HIGH so that each of the AND gates 90, 92, 94 and 96 has one input that is HIGH, and thus the output of the AND gates 90, 92, 94 and 96 will depend on whether the expect data or compliment expect data is HIGH or LOW. When the input of the expect data or compliment expect data is HIGH, the respective gate 90, 92, 94, 96 will output a HIGH signal; when it is LOW, it will output a LOW signal. This will be described in more detail presently.

When a read operation occurs as indicated above, each of the gates of the transistors 10a–10n, 16a–16n, 22a–22n and 28a–28n is connected to the respective true or compliment data out of the memory being read. Referring now particularly to transistors 10a–10n and assuming that in the even numbered memory cells a logic "0" had been written, this would constitute a LOW value. Assuming that a "0" is read out of each of these memory cells, none of the transistors 10a–10n will turn on, and thus node 12 will remain HIGH; inverter 70 will invert the signal to a LOW and thus one input to AND gate 80 is LOW. The second input to the AND gate 80 is from the AND gate 90, and the inverse of the expect data is "1" (since the expect data is "0"). However, the output from AND gate 80 will be LOW since the inverter 70 has inverted the signal to LOW, and thus the input to the OR gate 102 from AND gate 80 is LOW.

In the same manner, the node 18 having been precharged HIGH, and the compliment of the expect data (the compliment being "1" when the expect data is "0") is received on the gates of each of the transistors 16a–16n, or indeed on any one of the transistors 16a–16n, node 18 will be pulled LOW through transistor 38 and the LOW signal on the node 18 will be inverted by inverter 72 to a HIGH which forms one input to AND gate 82. However, since the input to AND gate 92 is the expect data, which in this case is "0" or LOW, there would be outputted from AND gate 92, and hence one of the inputs to AND gate 82 will be LOW and thus there will be a LOW signal outputted from AND gate 82, resulting in a LOW input to OR gate 102.

The transistors 22a–22n operate in a similar manner for the true data on the odd numbered outputs, and the transistors 28a–28n operate in a similar manner for the compliment data supplied by the odd numbered outputs.

The operation of the NOR gate 106 operates to define certain failures that are not detectible otherwise and will be described presently. Suffice it to say at this point that since the output from the inverter 72 is HIGH, which is one input to NOR gate 106, the output of NOR gate 106 will be LOW and thus there will be a LOW input to OR gate 102. The NOR gate 108 operates in a similar fashion. Thus when the data read out is what is expected from all of the memory outputs, there will be LOW output from OR gate 102 indicating a valid or good data test.

Next, consider what happens if stored data is "1". In such a case, transistors 10a–10n will be turned on if any one of the cells outputs a "1", which will draw node 12 to LOW. Inverter 70 will output a HIGH signal to AND gate 80. However, when the expect data is "1", the compliment is "0", and thus AND gate 90 will output a LOW signal as input to AND gate 80, and a LOW signal will be generated from AND gate 80 to OR gate 102. However, compliment of the expect data, when the expect data is "1", is a "0", and hence if all of the transistors 16a–16n receive the "0" compliment data none will turn on. Node 18 will then stay HIGH and the inverter 72 will go LOW. Hence, even though the input to AND gate 82 from AND gate 92 is HIGH, the input to AND gate 82 from the inverter 72 is LOW and thus a LOW signal is generated to the OR gate 102. Similarly, the odd numbered memory outputs as impressed on transistors 22a–22n and 28a–28n produce a LOW signal out of gates 84 and 86 to the OR gate 102. Also, at least one of the signals to NOR gates 106 and 108 will be HIGH, thus generating a LOW output. Thus, the memory test will have passed if all of the transistors 10a–10n, 16a–16n, 22a–22n and 28a–28n receive the data expected or compliment data which corresponds to the data which is written.

Turning now to a condition where the data from one or more of the memory cells read is other than that which is expected from that cell, the OR gate 102 will output a HIGH signal indicating such an error. Consider first the case where the data expected from the even numbered outputs is a "0" and the actual data that is read from one or more of the outputs is a "1". In such a case, the corresponding transistor (s) 10a–10n will be turned on, thus connecting node 12 to node 14, which is held at ground through transistor 36. Node 12 thus being brought LOW, inverter 70 will output a HIGH signal to AND gate 80. Since the compliment of the expect data is a "1" (the expect data being "0"), the output from AND gate 90 is HIGH, thus providing two HIGH inputs to AND gate 80 which provides a HIGH output to OR gate 102 which will then output a HIGH signal indicating a failure of one or more of the cells. It does not matter what the other outputs are, since any one HIGH input to OR gate 102 will result in a high output. A similar result would happen if a "1" is outputted from one of the odd numbered memory outputs when a "0" is expected.

Consider now the case where the data expected is "1" and the output is actually "0". In this case, the respective transistor 16a–16n, since it receives the compliment of the data will be expecting a "0" but would actually receive a "1". This would draw the node 18 to ground, providing a LOW input signal to inverter 72 which would invert the signal to a HIGH signal as one input to gate 82. Since the data expected in this case is a "1", AND gate 92 would output a HIGH signal, thus inputting two HIGH signals to AND gate 82, the output of which then would be a HIGH signal constituting a failure. Thus, when the data expected is a "0" and a "1" is outputted, this failure will be detected by the true data out transistors, either 10a–10n or 22a–22n; and when the data expected is a "1" and the actual data out is a "0", this error would be detected by the compliment data out transistors 16a–16n and 28a–28n.

The NOR gates 106 and 108 and their associated circuitry are provided to detect certain types of defects which would not normally be detected by the circuitry as thus described. These types of defects can be stuck word lines, etc., as will be explained presently. The NOR gates 106 and 108 do not rely on the receipt of expect data; rather they rely on the fact that, if the proper data is being read on both the true and the compliment transistors, then the output of one or the other of the inverters 70 or 72 to the NOR gate 106 or 74 or 76 to NOR gate 108 will be HIGH. As long as one of the inputs to NOR gate 106 is HIGH, the output from NOR gate 106 will remain LOW. Similarly if one of the inputs to NOR gate 108 is HIGH, there will be no output HIGH signal from NOR gate 108. However, if because of a defect as will be explained presently, when the outputs of both the inverters 70 and 72 are LOW or the outputs of both the inverters 74 and 76 are LOW, this will result in three LOW signals to NOR gate 106 or 108, it being remembered that load result is always on during the reading of the array and thus with inverters 110 and 112 constitutes LOW signals to NOR gates 106 and 108. In turn, a HIGH signal will be generated from either NOR gate 106 or NOR gate 108, depending upon which pair of inverters generated LOW signals. This also will result in a HIGH signal being generated from OR gate 102. The following failures are captured by the NOR gates 106 and 108 and associated circuitry, which would not otherwise be captured since the NOR gates 106 and 108 check to determine if at least one of the precharged nodes of the true/compliment pair OR gate is actuated:

1. The output clock does not operate to give a signal, thus causing the dynamic outputs to stay in their precharged state (READ CONTROL OPEN).
2. The output clock operates, but at the incorrect time so as to keep the output data in precharged state when sampling.
3. The output clock and restore clock overlap, and the restore "wins out" to leave the outputs in their precharged state when sampling.
4. The sampling clock is open during restore so true output data is never captured, but rather only precharged data is captured.
5. There may also be a design defect that causes one of the two T/C outputs to always stay in its precharged state.

Figure 2:
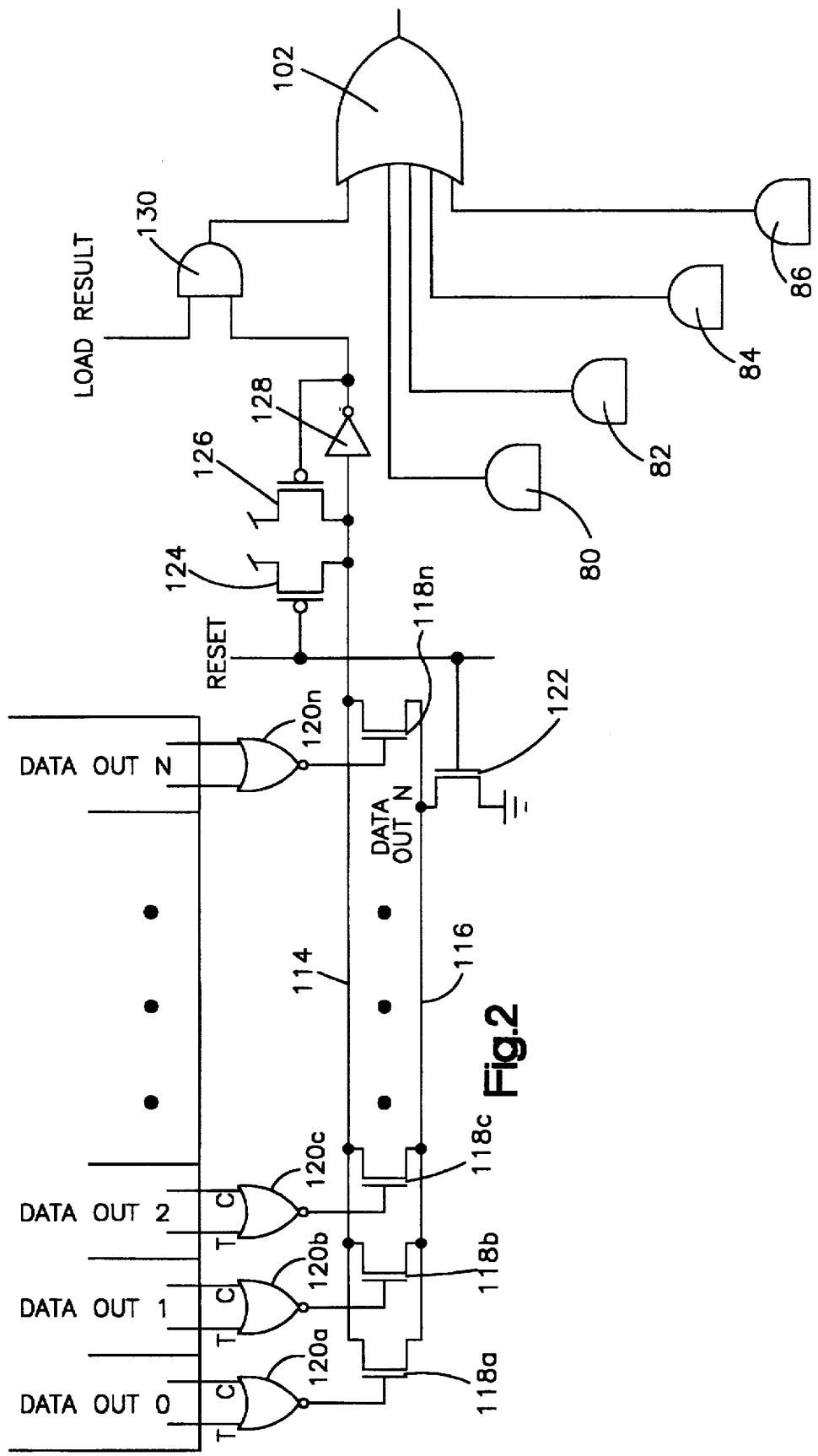
FIG. 2 is another embodiment of the data compression system for use in a built-in self-test device.

Referring now to FIG. 2, a system similar to that shown in FIG. 1 is provided, but the technique for detecting stuck word lines or other types of similar failures is modified somewhat. In this instance, a pair of additional nodes 114 and 116 are provided. NFET transistors 118a–n are connected across the nodes 114 and 116. But in this case, there are transistors for each of the odd and even numbered memory outputs. True and compliment data is provided from each memory output to corresponding NOR gates 120a–120n, the outputs of which are applied to the transistors 118a–118n. Node 116 is connected to ground through NFET 122, and PFETs 124 and 126 are connected to node 114. Thus, the circuit is similar to those previously described. The node 114 is connected through inverter 128 to AND gate 130. The output of which is connected as an additional input to OR gate 102. Load result provides the other input to AND gate 130. In the case that a fault causes both true and complement data to be a "0" from any memory output, the corresponding NFET 118a–118n will turn on, driving node 114 low. This will result in a high signal from inverter 128 to AND gate 130. Since load result is high, AND gate 130 will output a high signal to OR gate 102, thus signalling an error output from OR gate 102. This not only captures the types of errors that are captured with gates 106 and 108 in the previous embodiment, but also will capture similar type errors specific to a single one or multiple, but less than all, outputs.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A computer memory system having a logic circuit for determining if one or more of a group of memory cells at a given location in the memory system have a binary bit stored therein which is different from an expected value, comprising, said logic circuit having a first portion thereof including a plurality of logic devices to simultaneously read the True value of each of the bits from the memory at said given location and generate a first given signal which is a function of value of the data read, and a second portion thereof having a plurality of logic devices to simultaneously read the Complement value of each of the bits from the memory at said given location and generate a second given signal which is a function of the value of the data read, said logic circuit including logic devices to generate compare signals as a function of the expected data and generate a fail signal if either the first or second given signal differs from the compare signals.

2. The system of claim 1 wherein said logic devices to generate compare signals include devices to generate a signal which is a function of the True data expected and devices to generate a signal which is a function of the Complement data expected.

3. The memory system of claim 1 wherein said logic devices to read the True and Complement values of the data includes a plurality of transistors, each coupled to read the value of a bit from one cell of said memory system at said given location.

4. The memory system of claim 3 wherein each of said transistors is coupled between first and second nodes, and logic devices to selectively connect said first node to ground and charge the second node to a given voltage value, and wherein the gates of said transistors are each coupled to selectively read the outputs of one of said memory cells at said given location.

5. The memory system of claim 4, including circuitry to connect said first and second nodes through any of said transistors turned on when said first node is at ground and said second node is at said given value.

6. The memory system of claim 4 wherein said compare signal is generated on said second node.

7. The memory system of claim 1 wherein there is a second logic circuit having a first portion thereof including a plurality of logic devices to simultaneously read the True value of each of the bits from the memory at a second location and generate a first given signal which is a function of the value of the data read, and a second portion thereof having a plurality of logic devices to simultaneously read the Complement value of each of the bits from the memory at said second location and generate a second signal which is a function of the value of the data read, said logic circuit including logic devices to generate compare signals from expect data and generate an indicator signal if either the first or second signal differs from the compare signals in said second logic circuit.

8. The memory system of claim 7 wherein said first and second locations are interleaved with each other.

9. The memory system of claim 4 wherein logic circuitry is provided to determine if said first and second nodes are precharged to their given values.

10. The memory system of claim 4 wherein logic circuitry is provided to determine if the True and Complement data from any cell is the same, and generate said fail signal if the True and Complement data from any cell is the same.

11. A method of determining if one or more of a group of binary bits stored in memory cells in a given location in a storage device has a value different from that expected, comprising the steps of:

simultaneously reading the true value of each of the bits from the cells of the storage device at said location into a first portion of a logic circuit and the compliment of said true value of said bits from said storage device at said given location into a second portion of said logic circuit, and generating a given signal which is a function of said value read;

generating a fail signal from said logic circuit if any of said bits read into said logic circuit is different from the expected value.

12. The method of claim 11, further characterized by generating first and second compare signals which are a function of the True and Complement data expected, respectively, and wherein said compare signals are compared to the True and Complement value read from said storage device.

13. The method as defined in claim 12 wherein said True value is read to the transistor coupled across first and second nodes in said first portion of the circuit, and the Complement values are read to transistors coupled across first and second nodes in said second portion of said circuit.

14. The method as defined in claim 13 wherein the second node in each portion of the circuit is precharged to a given voltage level, and the first node is held at ground, and the compare signal is generated by said second node in each portion of the circuit.

15. The method as defined in claim 14 wherein a fail signal is generated if either of said second node is not precharged to said given value.

16. The method of claim 11 further characterized by reading the True and Complement values of data stored in a second group of cells at a second location in said memory device into first and second portions of a second logic circuit; and generating an indicator signal from said logic circuit if any of the bits read into said second logic circuit is different from the expected value.

17. The method of claim 11 further characterized by comparing the True and Complement data read from each cell, and generating said fail signal if they are the same for any cell.

* * * * *